United States Patent
Tsunemine (10) Patent No.: US 6,853,026 B2
(45) Date of Patent: Feb. 8, 2005

(54) SEMICONDUCTOR DEVICE (75) Inventor: Yoshikazu Tsunemine, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/291,597

(22) Filed: Nov. 12, 2002

(65) Prior Publication Data
US 2003/0218201 A1 Nov. 27, 2003

(30) Foreign Application Priority Data
May 23, 2002 (JP) .................................. 2002-148915

(51) Int. Cl.⁷ ...................... H01L 27/108; H01L 29/76
(52) U.S. Cl. ...................................... 257/306; 257/302
(58) Field of Search .................................. 257/306, 302

(56) References Cited

U.S. PATENT DOCUMENTS

| | | | |
|---|---|---|---|
| 6,235,603 B1 | 5/2001 | Melnick et al. | |
| 6,384,443 B1 | 5/2002 | Tsunemine | |
| 2002/0135010 A1 * | 9/2002 | Sheu et al. | ................. 257/306 |

FOREIGN PATENT DOCUMENTS

| | | |
|---|---|---|
| DE | 101 30 626 A1 | 6/2001 |
| JP | 8-330538 | 12/1996 |
| JP | 2001-210803 | 8/2001 |

OTHER PUBLICATIONS

H. Itoh, et al., Symposium on VLSI Technology Digest of Technical Papers, pp. 106–107, "a New Cell Technology for the Scalable BST Capacitor Using Damascene–Formed Pedestal Electrode with a [Pt–Ir] Alloy Coating", 2000.

* cited by examiner

Primary Examiner—Amir Zarabian
Assistant Examiner—Kiesha Rose
(74) Attorney, Agent, or Firm—Oblon, Spivak, McClelland, Maier & Neustadt, P.C.

(57) ABSTRACT

A semiconductor device in which an electrode is not allowed to easily deform even when a heat treatment is performed on a material forming the electrode during a damascene process for forming a stacked capacitor, and a manufacturing method thereof are provided. A conductive film 5 made of the same material as that of a capacitor lower electrode 6 is formed so as to be adhered to a top face of a conductive film 4 by a heat treatment. If the lower electrode 6 is made of a noble metal such as ruthenium, for example, the conductive film 5 is made of the same noble metal. Because of use of the same material for forming the conductive film 5 and the lower electrode 6, connection between the conductive film 5 and the lower electrode 6 is strengthened. Accordingly, it is easy to maintain connection between the conductive film 5 and the lower electrode 6 during a heat treatment on the lower electrode 6, so that the lower electrode is not likely to deform. For this reason, connection between the conductive plug 4 and the lower electrode 6 can be made more reliable than a structure in which the lower electrode 6 is connected directly to the conductive plug 4.

3 Claims, 13 Drawing Sheets

SEMICONDUCTOR DEVICE

BACKGROUND OF THE INVENTION

1. Field of the Invention

The present invention relates to a semiconductor device and a method of manufacturing a semiconductor device, more particularly to a semiconductor device including a stacked capacitor with a dielectric film made of a high dielectric constant material, and a manufacturing method thereof.

2. Description of the Background Art

A typical DRAM (Dynamic Random Access Memory) is composed of a memory cell array area serving as a memory region in which a great amount of information is stored, and a peripheral circuit area which is required for inputting data from, and outputting data to, an exterior. The memory cell array area which occupies a relatively large part of an entire area on a semiconductor chip includes a plurality of memory cells each storing a unit information which are arranged in a matrix.

A typical memory cell is composed of one MOS (Metal Oxide Semiconductor) transistor and one capacitor connected to the MOS transistor. Such a memory cell is generally called a one-transistor one-capacitor memory cell. Because of its structural simpleness, this type of memory cell makes it easy to increase an integration density of a memory cell array. For this reason, this type of memory cell has been widely used in a DRAM having a large capacity.

As for a capacitor, there have been several types of capacitors, among which a capacitor called a stacked capacitor is included. A stacked capacitor is a type in which electrodes and a dielectric film are formed so as to extend over a field oxide film and a gate electrode of a transistor, so that the electrodes face each other in an increased area. By virtue of the foregoing features, a stacked capacitor almost certainly ensures a sufficient static capacitance even if device miniaturization advances in accordance with increase in an integration density of a semiconductor memory device. As such, with the ever increasing of an integration density of a semiconductor memory device, a stacked capacitor has been more frequently used.

In order to adapt to further advance in device miniaturization, the vertical dimension of a stacked capacitor can be increased, which ensures that electrodes face each other in a sufficient area while preventing increase in the lateral dimension of the capacitor. However, in the recent days, as an element has been miniaturized to an extremely high degree, it has been getting difficult to ensure a predetermined static capacitance by using the above-mentioned method in which a structure of the capacitor is modified. Other typical three-dimensional capacitors such as a trench capacitor and a cylindrical capacitor have been placed in a situation similar to that of the stacked capacitor.

Figure 17:
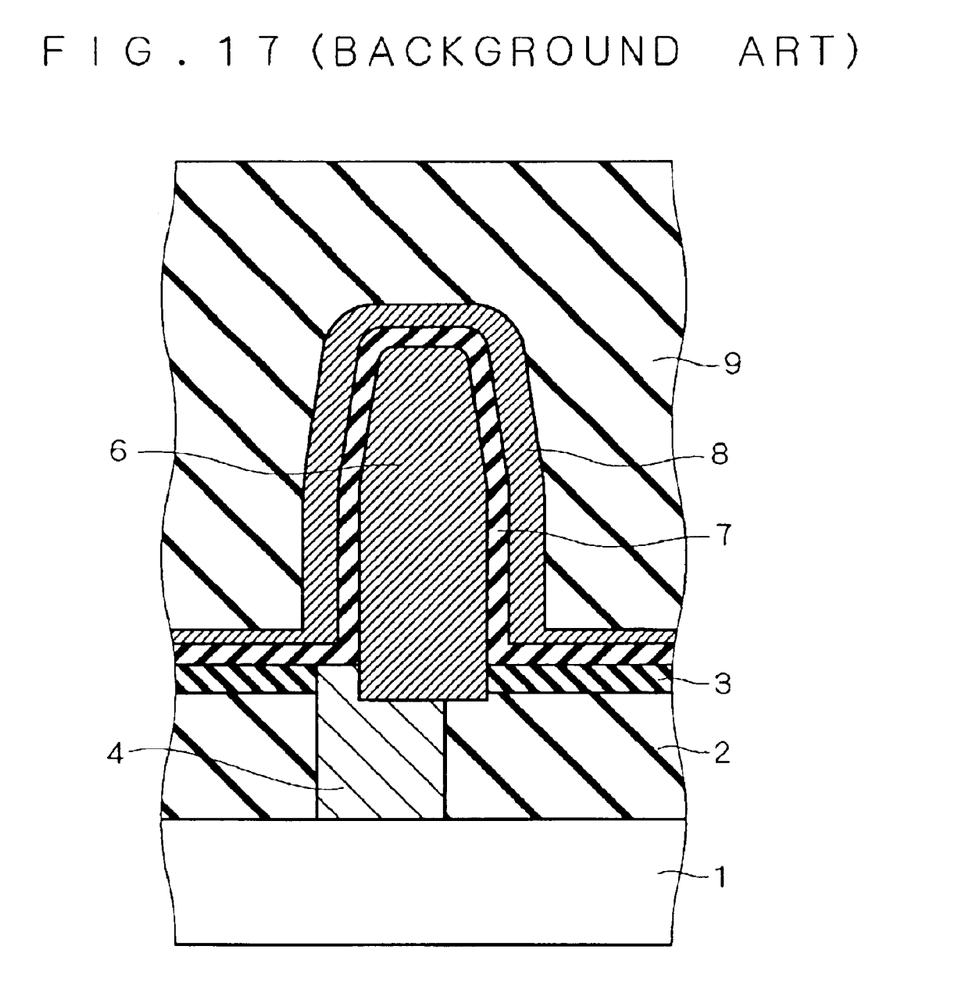
FIG. 17 is a view illustrating a semiconductor device according to a background art of the present invention.

In view of the foregoing, there has been made an attempt to employ a high dielectric constant material such as BST (barium strontium titanate) for forming a dielectric film, to increase a static capacitance of a capacitor. FIG. 17 is a sectional view of a capacitor area of a DRAM memory cell according to a background art of the present invention, in which a high dielectric constant material such as BST is employed for forming a dielectric film.

Referring to FIG. 17, a dielectric film 7 made of a high dielectric constant material is interposed between an upper electrode 8 and a lower electrode 6. The lower electrode 6 is connected to a conductive plug 4. The conductive plug 4 passes through first and second interlayer insulating films 2 and 3 formed on a semiconductor substrate 1, to be connected to a surface of the semiconductor substrate 1. Further, a third interlayer insulating film 9 is formed on the upper electrode 8. The foregoing elements form a stacked capacitor.

For the foregoing elements forming the stacked capacitor, a noble metal such as ruthenium, for example, is employed as the upper electrode 8 and the lower electrode 6, and titanium nitride, for example, which functions as a barrier metal is employed as the conductive plug 4. Also, each of the first and third interlayer insulating films 2 and 9 is made of a silicon dioxide film, for example, while the second interlayer insulating film 3 is made of a silicon nitride film, for example. The dielectric film 7 made of a high dielectric constant material such as BST is formed by a reactive sputtering process, a CVD (Chemical Vapor Deposition) process or the like.

Additionally, a transistor, an active region, an isolation region made of a silicon dioxide film, and the like are formed in the surface of the semiconductor substrate 1, though not shown. Further, an aluminum interconnect is formed above the stacked capacitor, which is also not shown.

In a capacitor of a conventional DRAM memory cell, polycrystalline silicon is employed for forming upper and lower electrodes, and a silicon dioxide film formed by thermal oxidation on silicon, a silicon nitride film formed by a CVD process, or the like, is employed for forming a dielectric film. Each of the above-mentioned films employed as the dielectric film is a silicon compound, which can be easily formed on the lower electrode made of polycrystalline silicon.

In contrast, in the stacked capacitor illustrated in FIG. 17 of the background art of the present invention, a noble metal is employed for forming the upper and lower electrodes as described above, for the following reasons. If a dielectric film made of BST, for example, is applied to the above-described conventional capacitor structure to form the dielectric film of BST on the lower electrode made of polycrystalline silicon, the polycrystalline silicon of the lower electrode which is electrochemically "base" (i.e., a base metal) will be readily oxidized due to an oxygen atom included in the BST of the dielectric film. As a result, a silicon dioxide film is formed in an interface between the dielectric film and the lower electrode. Because of a relatively low dielectric constant of the silicon dioxide film, the effects produced by employing a high dielectric constant material is nullified, to considerably reduce a static capacitance of the capacitor. Further, a resistance of the polycrystalline silicon as the lower electrode is increased. The same problems occurs in the upper electrode.

For the foregoing reasons, when a high dielectric constant material such as BST is employed for forming a dielectric film, a noble metal which is electrochemically noble and highly anti-oxidizable should be employed for forming upper and lower electrodes. Such a noble metal includes platinum, iridium, palladium or the like. That is because ruthenium is exemplarily cited as a material for the upper electrode 8 and the lower electrode 6 in the above description for the stacked capacitor illustrated in FIG. 17.

Further, the purpose of employing a material having a barrier property such as titanium nitride for forming the conductive plug 4 in the stacked capacitor illustrated in FIG. 17 is to prevent silicidation reaction between the lower electrode 6 and the semiconductor substrate 1, thereby to prevent increase of a resistance, or to prevent an oxygen atom from separating from the dielectric film 7 or the like and arriving at the semiconductor substrate 1 through the lower electrode 6, thereby to prevent the semiconductor substrate 1 from being oxidized.

As is known, it is difficult to etch a noble metal film into a desired pattern by using a photolithography technique or conventional etching techniques. Accordingly, to form a minute structure such as the lower electrode 6 illustrated in FIG. 17 by using a noble metal will involve difficulties.

Hereupon, a damascene process has been employed for patterning a noble metal film. More specifically, a mold made of a silicon dioxide film or the like which is relatively easy to etch is formed on a substrate, and an opening of a desired shape for an electrode is formed in the mold. Subsequently, a noble metal film is buried in the opening, and a surface of the buried noble metal film is planarized by a CMP (Chemical Mechanical Polishing) process or the like. Then, the mold is removed, to complete a minute electrode of the noble metal film. In a damascene process, fine processing is performed on a silicon dioxide film, which makes it easier to manufacture a device as compared with a case where fine processing is performed directly on a noble metal film.

A damascene process is applicable to the background art of the present invention illustrated in FIG. 17, in which the lower electrode 6 is formed by burying a noble metal film in an opening of a mold. At that time, a heat treatment is performed on the noble metal film in order to allow the noble metal film to keep a desired shape for an electrode. The heat treatment causes the noble metal film forming the lower electrode 6 to shrink in the opening of the mold, resulting in deformation of the lower electrode 6, to pose a problem.

Figure 18:
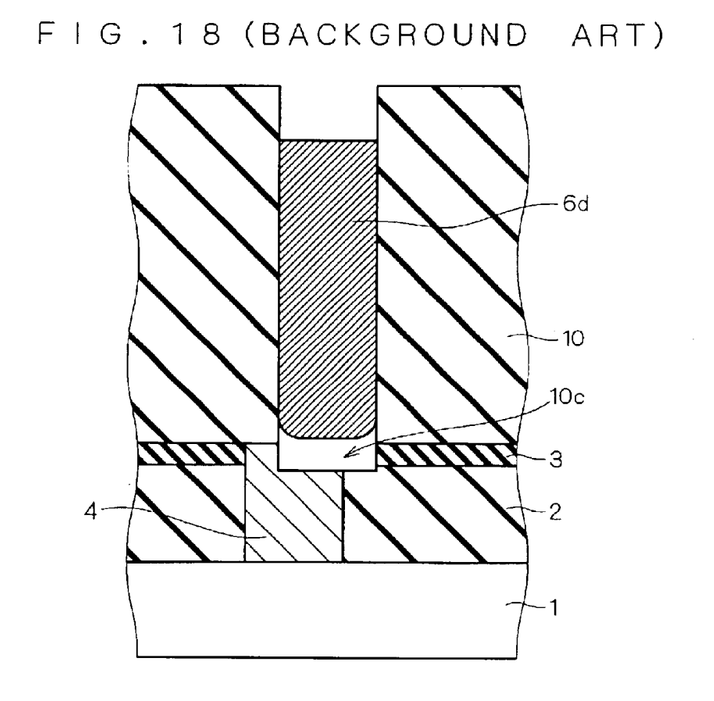
FIGS. 18 and 19 are view for illustrating a problem associated with the semiconductor device according to the background art of the present invention.

FIG. 18 is another sectional view of the same stacked capacitor as illustrated in FIG. 17 for illustrating the problem mentioned above. More specifically, FIG. 18 shows a state where a noble metal film 6d buried as the lower electrode 6 in an opening of a mold 10 shrinks, so that a vacancy 10c is left between the noble metal film 6d and the conductive plug 4. It is generally considered that such a phenomenon occurs due to the heat treatment on the noble metal film 6d in which oxygen or the like contained in the noble metal film 6d is discharged in a gas phase. Accordingly, no contact can be made between the noble metal film 6d and the conductive plug 4 in the state as shown in FIG. 18, and thus the noble metal film 6d does not function as the lower electrode 6.

Figure 19:
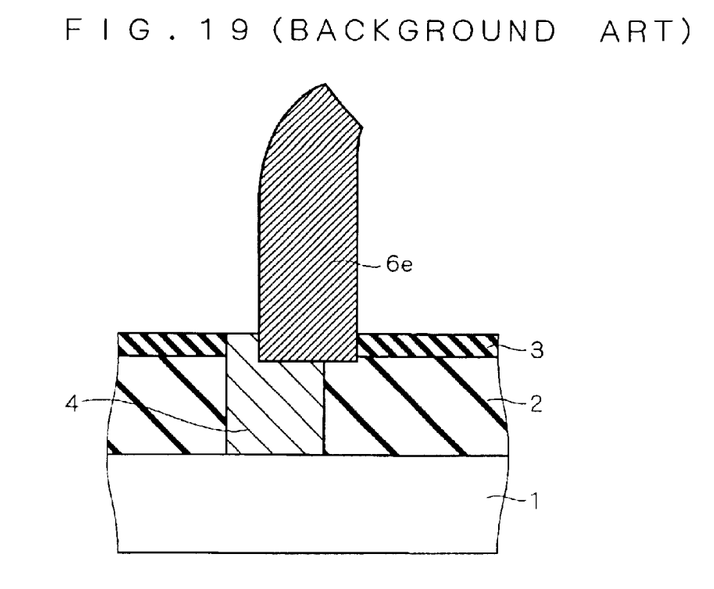

One conceivable solution to avoid the above-described problem is to perform a heat treatment on the noble metal film 6d after removing the mold 10. However, this would allow the noble metal film to easily shrink differently among respective portions of the noble metal film, resulting in formation of a deformed lower electrode 6e as illustrated in FIG. 19. In a state as illustrated in FIG. 19, it is likely that the lower electrode falls down or comes into contact with another lower electrode near the lower electrode, to pose another problem.

Otherwise, the vacancy 10c between the noble metal film 6d and the conductive plug 4 may not be left. Even in such a situation, however, it is probable that connection between the noble metal film 6d and the conductive plug 4 is weakened due to shrinkage of the noble metal film 6d. In this situation, there is a high possibility that the lower electrode 6 is detached from the conductive plug 4 upon vibration or impact on a finished device. The finished device has a low resistance to impact or the like.

SUMMARY OF THE INVENTION

It is an object of the present invention to provide a semiconductor device in which an electrode is not allowed to easily deform even when a heat treatment is performed on a material forming the electrode during a damascene process for forming a stacked capacitor, and a manufacturing method thereof.

According to a first aspect of the present invention, a semiconductor device includes a semiconductor substrate, an interlayer insulating film, a contact hole, a conductive plug, a conductive film, a first capacitor electrode, a capacitor dielectric film and a second capacitor electrode. The interlayer insulating film is formed on the semiconductor substrate. The contact hole passes through the interlayer insulating film to reach a surface of the semiconductor substrate. The conductive plug is formed in the contact hole and connected to the surface of the semiconductor substrate. The conductive film is formed in the contact hole so as to be adhered to a top face of the conductive plug. The first capacitor electrode is connected to the conductive film. The capacitor dielectric film is in contact with the first capacitor electrode. The capacitor dielectric film is interposed between the first and second capacitor electrodes, to form a capacitor. The conductive film is made of a material identical to that of the first capacitor electrode.

Connection between the first capacitor electrode and the conductive film can be easily maintained during a heat treatment on the first capacitor electrode in a manufacturing process employing a damascene process. Hence, the first capacitor electrode is not likely to deform. Accordingly, connection between the first capacitor electrode and the conductive plug is strengthened as compared with a structure in which the first capacitor electrode is connected directly to the conductive plug. As a result, a semiconductor device highly resistant to vibration or impact can be obtained. Further, if the conductive film and the first capacitor electrode are made of different materials, a substance constituting the conductive film is possibly diffused through the first capacitor electrode to adversely affect the capacitor dielectric film being in contact with the first capacitor dielectric film. However, in accordance with the present invention, by choosing an appropriate material for forming the first capacitor electrode, it is possible to prevent such adverse effects.

According to a second aspect of the present invention, a semiconductor device includes a semiconductor substrate, an interlayer insulating film, a contact hole, a conductive plug, a silicon interlayer film, a first capacitor electrode, a capacitor dielectric film and a second capacitor electrode. The interlayer insulating film is formed on the semiconductor substrate. The contact hole passes through the interlayer insulating film to reach a surface of the semiconductor substrate. The conductive plug is formed in the contact hole and connected to the surface of the semiconductor substrate. The silicon interlayer film is formed above the interlayer insulating film. The first capacitor electrode which is made of a metal passes through the silicon interlayer film and is electrically connected to the conductive plug. The capacitor dielectric film is in contact with the first capacitor electrode. The capacitor dielectric film is interposed between the first capacitor electrode and the second capacitor electrode, to form a capacitor. Silicidation reaction occurs in an interface between the silicon interlayer film and the first capacitor electrode.

Because of the silicidation reaction in the interface between the silicon interlayer film and the first capacitor electrode, the silicon interlayer film and the first capacitor electrode are adhered to each other so that the first capacitor electrode is fixed by the silicon interlayer film. Hence, connection between the first capacitor electrode and the conductive plug can be easily maintained during a heat treatment in a manufacturing process employing a damascene process, so that the first capacitor electrode is not likely to deform. Accordingly, connection between the first capacitor electrode and the conductive plug is further strengthened. As a result, a semiconductor device highly resistant to vibration or impact can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiments

First Preferred Embodiment

A first preferred embodiment includes a semiconductor device and a manufacturing method thereof, in which a conductive film made of the same material as that of a capacitor electrode is formed so as to be adhered to a top face of a conductive plug, so that an electrode is not allowed to easily deform even when a heat treatment is performed on a material forming the electrode during a damascene process for forming the capacitor electrode.

Figure 1:
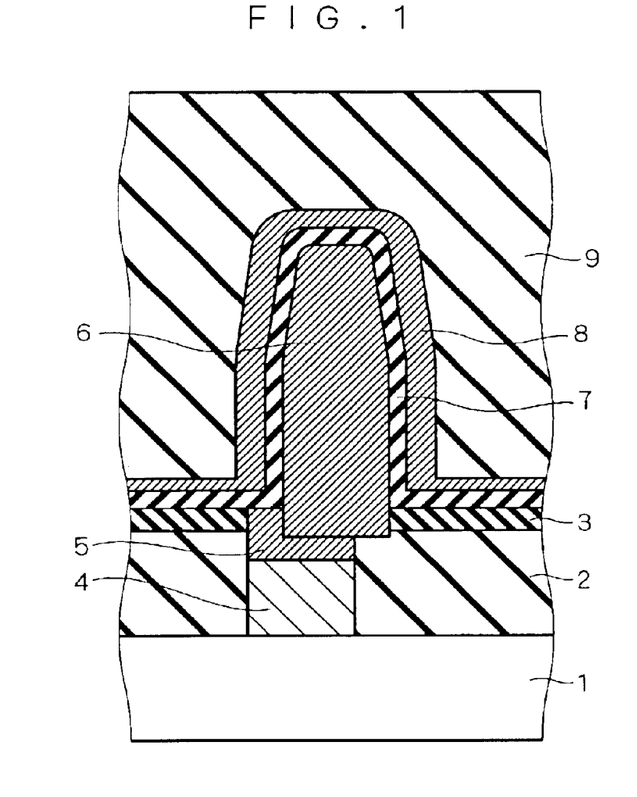
FIG. 1 is a view illustrating a semiconductor device according to a first preferred embodiment of the present invention.

FIG. 1 is a sectional view illustrating the semiconductor device according to the first preferred embodiment. FIGS. 2 through 13 are views illustrating respective steps of the method of manufacturing the semiconductor device illustrated in FIG. 1. In FIGS. 1 through 13, each element having the same function as that of any of the elements illustrated in FIG. 17 is denoted by the same reference numeral as used in FIG. 17.

Referring to FIG. 1, in the semiconductor device according to the first preferred embodiment, like the semiconductor device illustrated in FIG. 17, a dielectric film 7 made of a high dielectric constant material is interposed between an upper electrode 8 and a lower electrode 6. Also, a conductive plug 4 passes through first and second interlayer films 2 and 3 formed on a semiconductor substrate 1, to be connected to a surface of the semiconductor substrate 1. Further, a third interlayer insulating film 9 is formed on the upper electrode 8.

A noble metal such as ruthenium, for example, is employed as the upper electrode 8 and the lower electrode 6, and titanium nitride, for example, which functions as a barrier metal is employed as the conductive plug 4. Also, each of the first and third interlayer insulating films 2 and 9 is made of a silicon dioxide film, for example, while the second interlayer insulating film 3 is made of a silicon nitride film, for example. The dielectric film 7 made of a high dielectric constant material such as BST is formed by a reactive sputtering process, a CVD process or the like.

The semiconductor device according to the first preferred embodiment is different from the semiconductor device illustrated in FIG. 17 in that a conductive film 5 is formed so as to be adhered to a top face of the conductive plug 4. Electrical connection between the lower electrode 6 and the conductive plug 4 is made via the conductive film 5.

The conductive film 5 is made of the same material as is employed for forming the lower electrode 6 functioning as a capacitor electrode. If a noble metal such as ruthenium is employed for forming the lower electrode 6, the same noble metal is employed for forming the conductive film 5.

The foregoing elements form a stacked capacitor. Additionally, a transistor, an active region, an isolation region and the like are formed in the surface of the semiconductor substrate 1, though not shown in FIG. 1. Further, an aluminum interconnect is formed above the stacked capacitor, which is also not shown.

Below, the method of manufacturing a semiconductor device according to the first preferred embodiment will be described.

First, the isolation region, the active region, the transistor and the like (each of which is not shown) are formed in the semiconductor substrate 1 of for example, silicon. Secondly, the first interlayer insulating film 2 made of a silicon dioxide film and the second interlayer insulating film 3 made of a silicon nitride film are sequentially deposited on the semiconductor substrate 1 by a CVD process or the like. Subsequently, a contact hole 2a which passes through the first and second interlayer insulating films 2 and 3 and reaches the active region and other elements in the surface of the semiconductor substrate 1 is formed.

Figure 2:
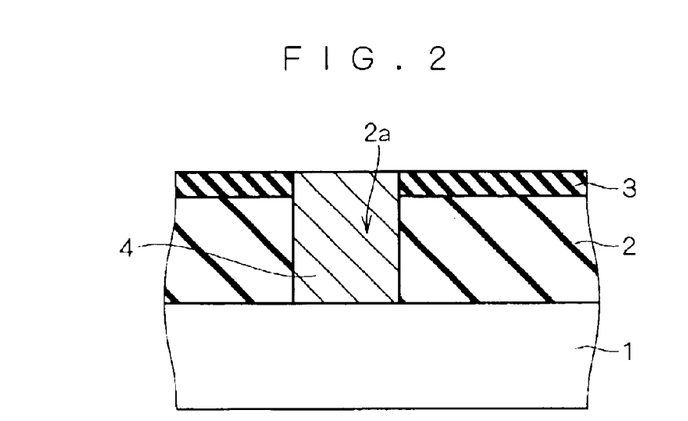
FIGS. 2 through 13 are views illustrating a method of manufacturing a semiconductor device according to the first preferred embodiment of the present invention.

Then, titanium nitride is buried in the contact hole 2a, to form the conductive plug 4 made of titanium nitride passing through the first and second interlayer insulating films 2 and 3 (FIG. 2). For formation of the conductive plug 4 made of titanium nitride, a film is formed by a thermal CVD process using titanium tetrachloride and an ammonia gas, and subsequently, a CMP process or an etch back process is performed on the formed film, for example. The second interlayer insulating film 3 functions as an etch stop in the CMP process or the etch back process.

Figure 3:
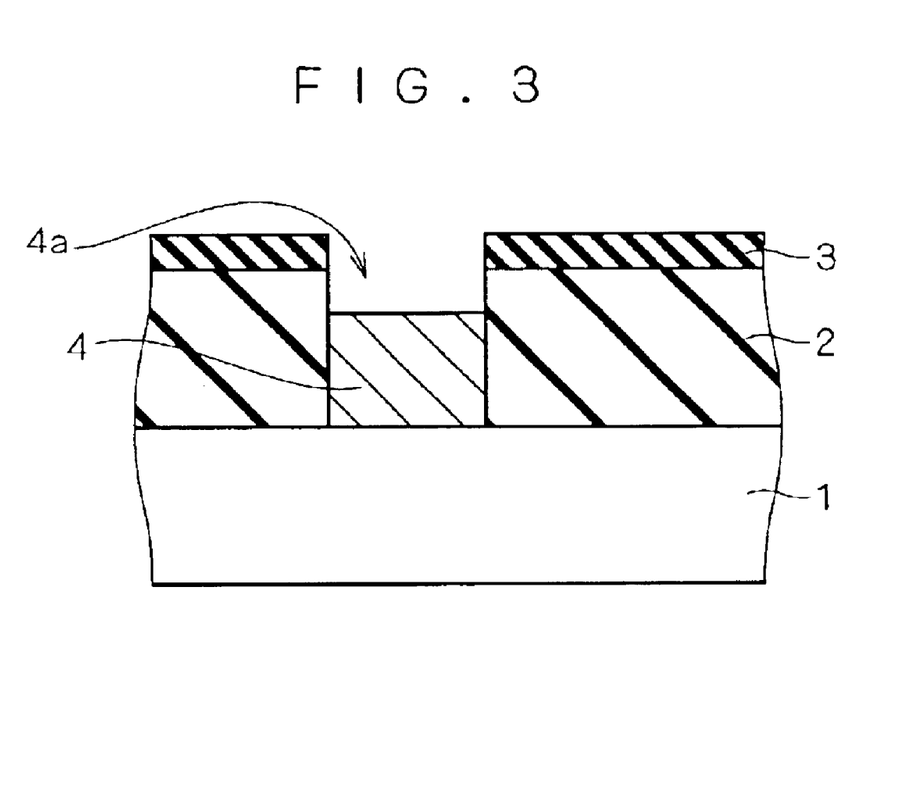

Thereafter, a top face of the conductive plug 4 buried in the contact hole 2a is selectively etched to form an opening 4a (FIG. 3). For this selective etching process, an RIE (Reactive Ion Etching) process using a chlorine gas as an etching gas can suitably be employed.

Further, while respective thicknesses of the first and second interlayer insulating films 2 and 3 vary depending on the height of the lower electrode 6 to be formed and a process employed for forming the lower electrode 6, it may be suitable to control the thicknesses of the first and second interlayer insulating films 2 and 3 to be in a range from 500 to 1000 nm, inclusive, and to be in a range from 50 to 100 nm, inclusive, respectively, for example. Also, it may be suitable to control the depth of the opening 4a to be in a range from 50 to 200 nm, inclusive.

Figure 4:
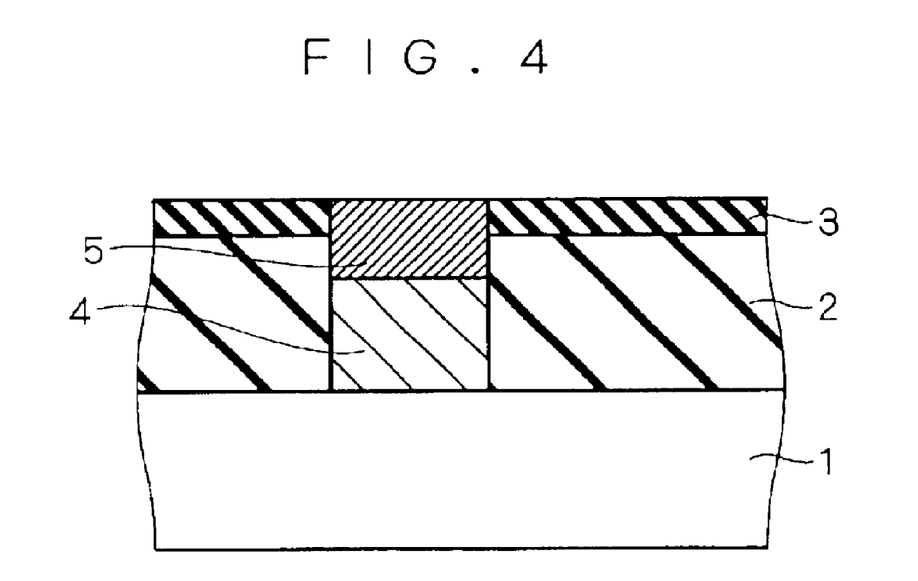

Next, the conductive film 5 is buried in the opening 4a (FIG. 4). If ruthenium is employed as the conductive film 5, the following procedures may be suitably used. First, a film is formed so as to have a thickness of approximately 200 nm by a sputtering process, and then a sputter etch process is conducted using an argon gas as an etching gas, to remove a portion of the formed film which is located on the second interlayer insulating film 3.

A heat treatment is conducted on the conductive film 5. As a result, interdiffusion of respective constituent atoms of the conductive film 5 and the conductive plug 4 is caused in an interface between the conductive film 5 and the conductive plug 4, which provides for increase in adherence of the conductive film 5 to the conductive plug 4. Thus, the conductive film 5 is adhered to the conductive plug 4.

Figure 5:
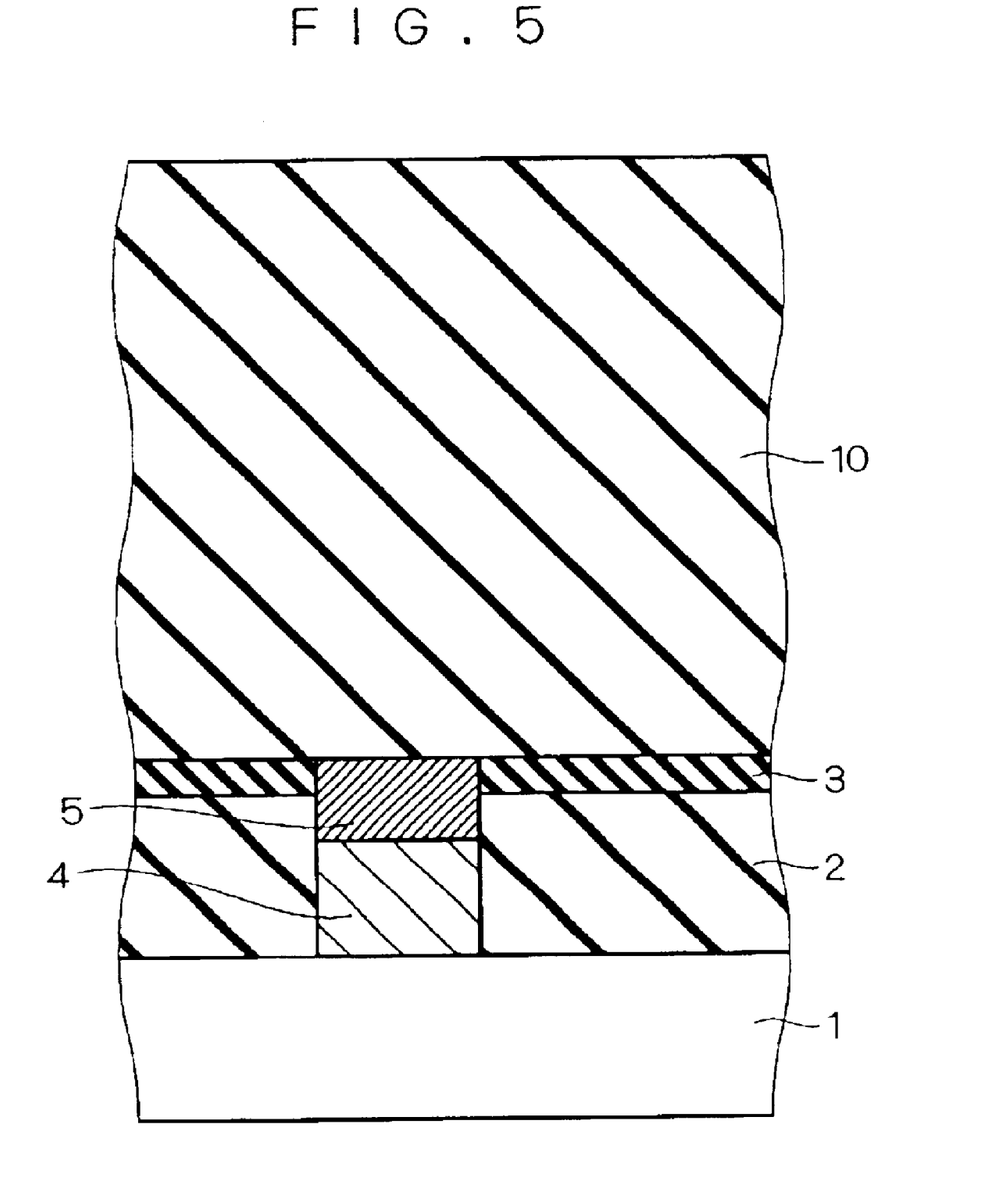

Thereafter, a mold 10 for a damascene process which is utilized to form the lower electrode 6 is formed so as to cover the second interlayer insulating film 3 and the conductive film 5 (FIG. 5). As a material of the mold 10, a silicon dioxide film may be suitably employed, for example. Further, for formation of the mold 10, a thermal CVD process using TEOS (tetraethoxysilane) and an oxygen gas as a source gas may suitably be performed to form a film for the mold 10. A temperature during formation of the film may be 680° C., for example. Moreover, it may be suitable to control the thickness of the film for the mold 10 to be in a range from 1000 to 5000 nm, inclusive, for example, depending on the height of the lower electrode 6 to be formed.

Figure 6:
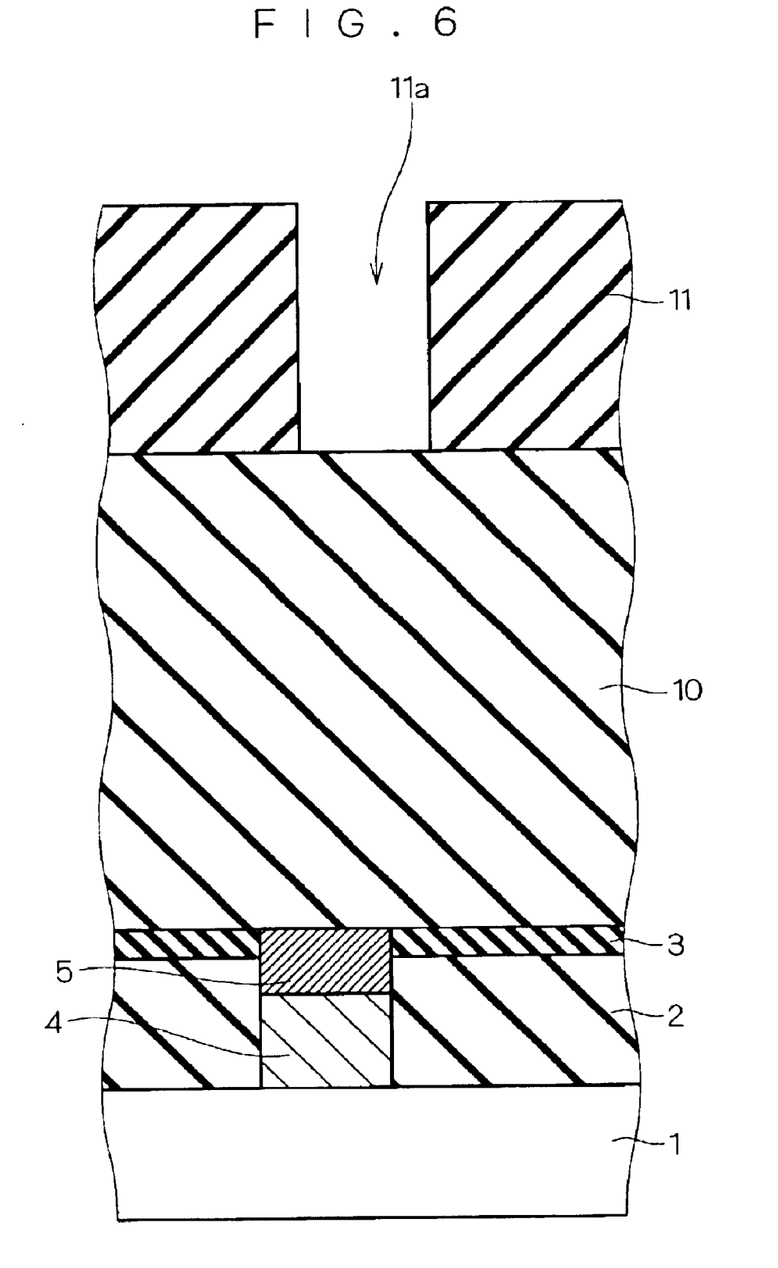

Subsequently, a photoresist 11 is formed on the mold 10, to be patterned to form an opening 11a (FIG. 6). A width of the opening 11a, which depends on the size of the lower electrode 6 to be formed, may be 200 nm, for example.

Figure 7:
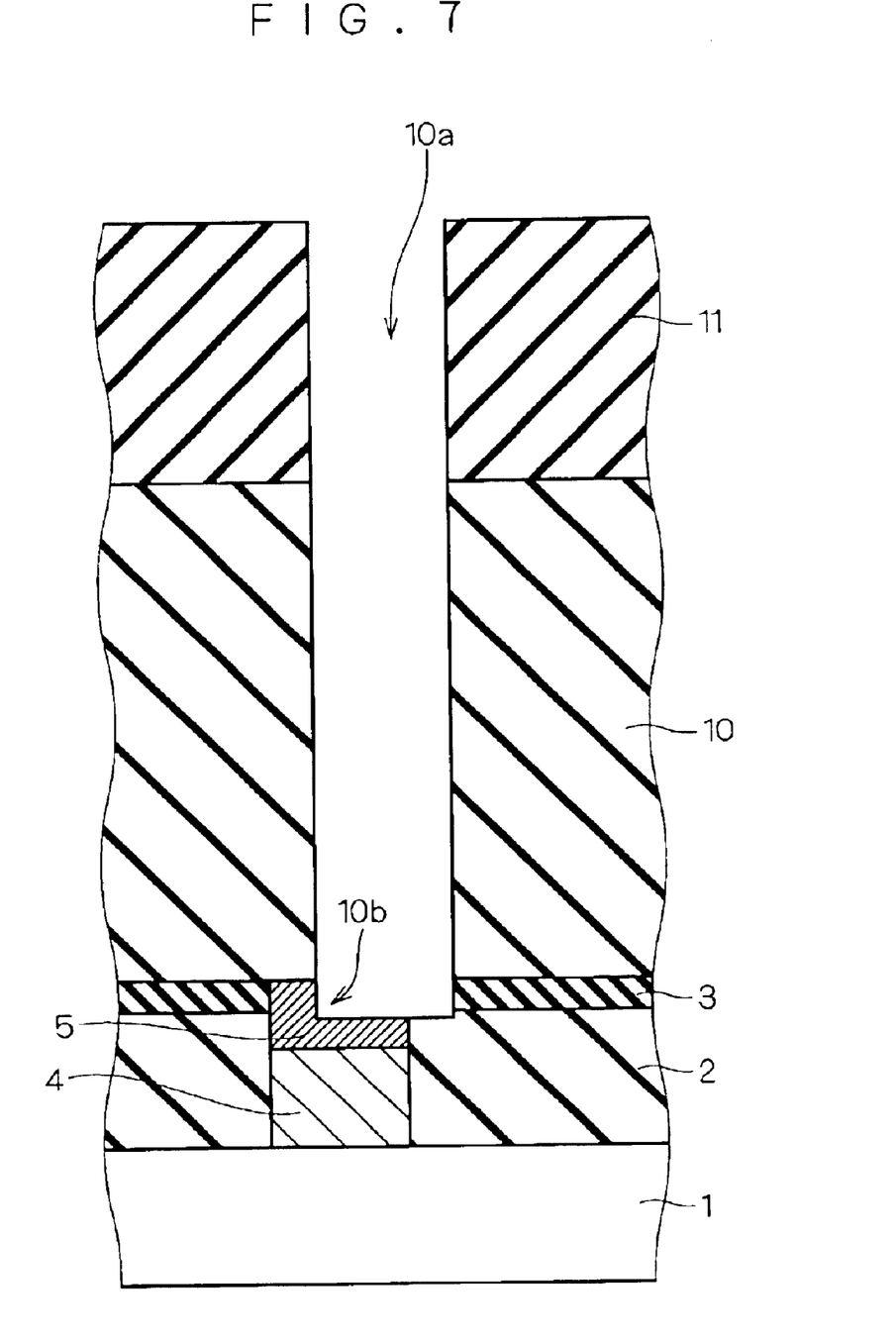

Next, the mold 10 is etched using the photoresist 11 as a mask, to form a contact hole 10a passing through the mold 10 to reach the conductive film 5 (FIG. 7). At that time, the contact hole 10a is formed such that: a bottom face of the contact hole 10a and a surface of the conductive film 5 do not completely overlap each other (in other words, a portion of the surface of the conductive film 5 remains in contact with the mold 10); and that the contact hole 10a digs into the conductive film 5. As a result of the contact hole 10a digging into the conductive film 5, a side 10b which is exposed in the contact hole 10a and is to correspond to a side of a bottom portion of the lower electrode 6 to be formed, is provided in the conductive film 5.

Figure 8:
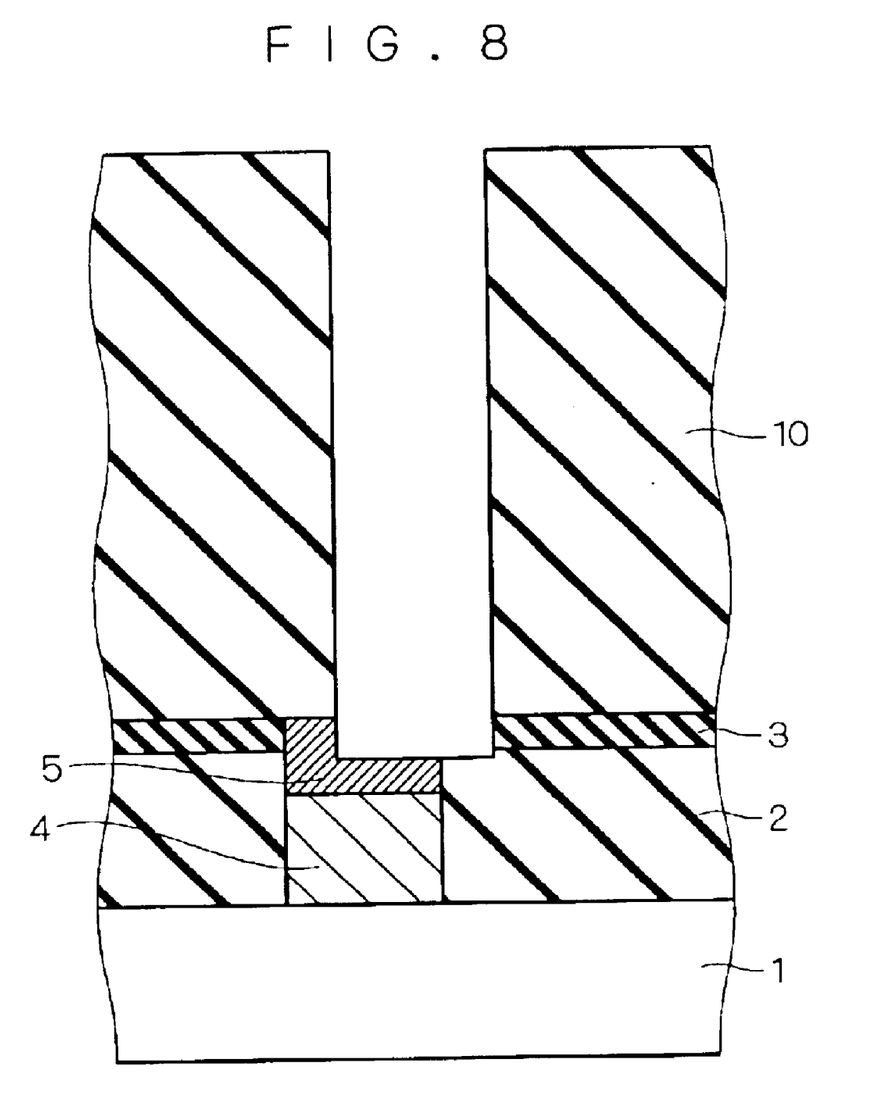

For formation of the contact hole 10a, an etching process using a mixed gas of carbon tetrafluoride, oxygen and argon may suitably be performed mainly on the mold 10 and the second interlayer insulating film 3, and another etching process using an oxygen gas may be performed mainly on the conductive film 5. After the etching processes, the photoresist 11 is removed by an oxygen plasma ashing process or the like, for example (FIG. 8).

Figure 9:
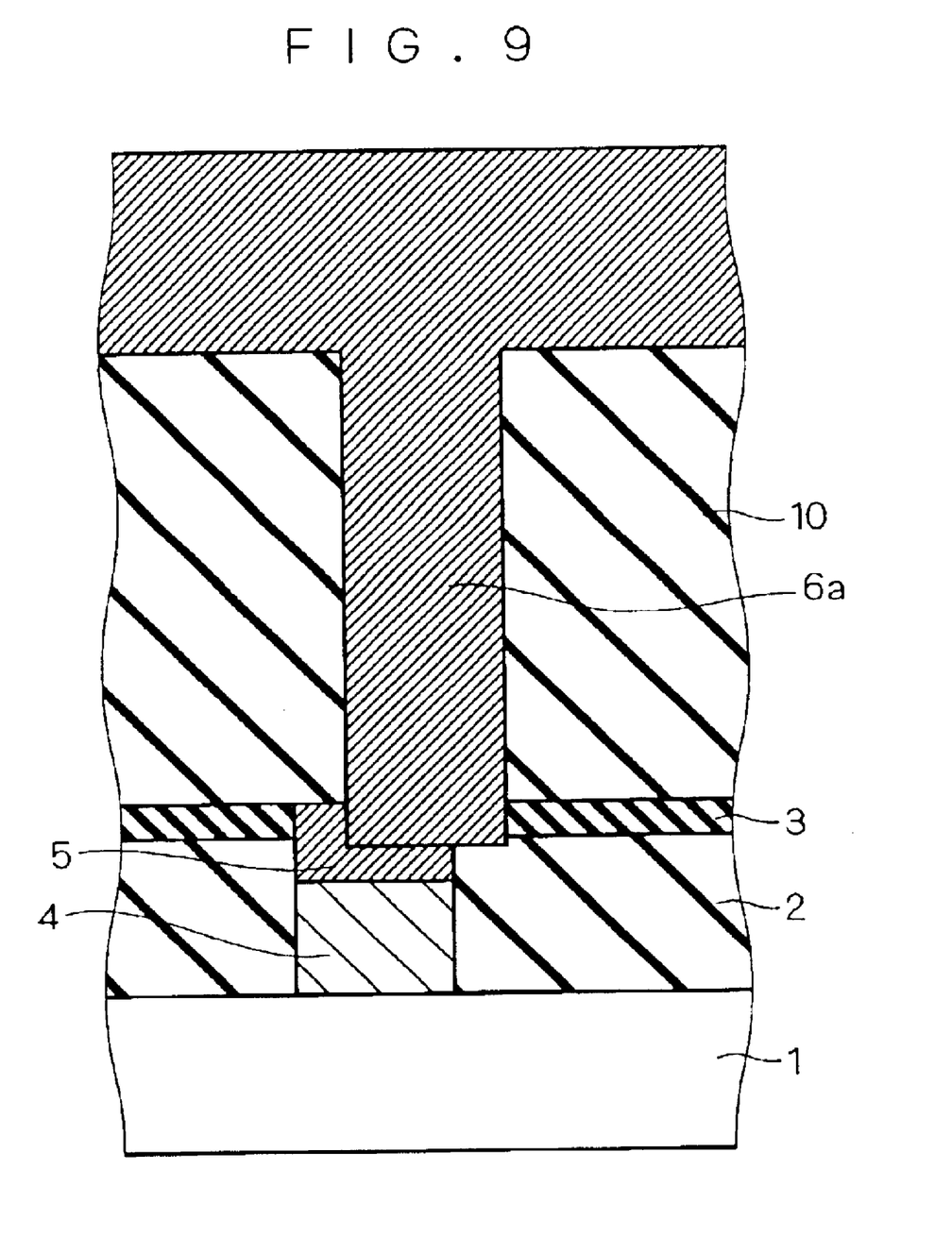
Figure 10:
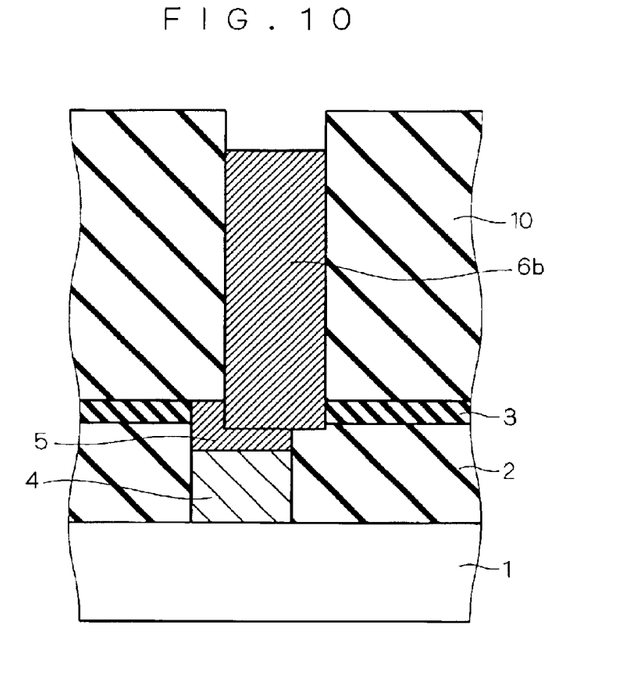

Then, a noble metal film 6a as a material of the lower electrode 6 is formed so as to fill the contact hole 10a by a CVD process, for example (FIG. 9). The thickness of the noble metal film 6a may be suitably controlled to be 150 nm, for example. Subsequently, a portion of the noble metal film 6a which is located above the mold 10 is removed by an etch back process, for example, so that a noble metal film 6b existing only within the contact hole 10a is provided (FIG. 10). For the etch-back process, an RIE process using an oxygen gas may be suitably employed, for example.

Figure 11:
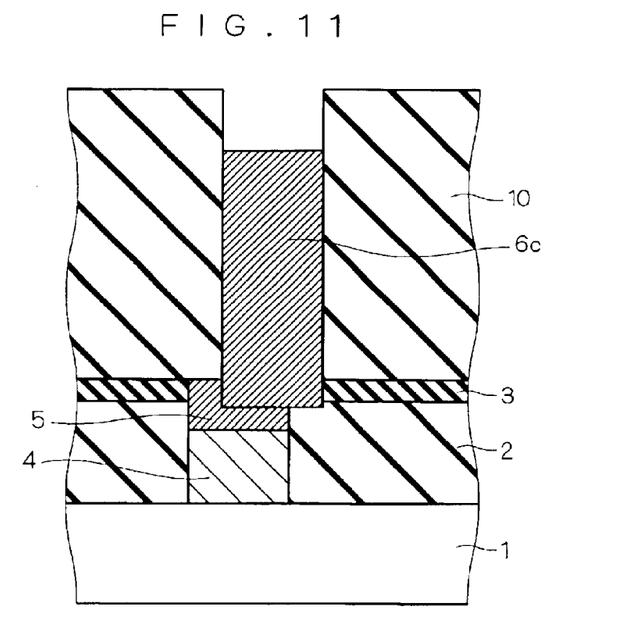

Next, a heat treatment is performed on the noble metal film 6b, to allow the lower electrode 6 to keep its desired shape (FIG. 11). For the heat treatment on the noble metal film 6b, it is general to control a temperature therefor to be substantially equal to, or larger than, the highest temperature in a process for forming the dielectric film 7 which is to be formed later. In the first preferred embodiment, the heat treatment on the noble metal film 6b may be suitably performed at a temperature of 700° C. for 60 seconds, for example. The heat treatment on the noble metal film 6b causes the noble metal film 6b to slightly shrink in the contact hole 10a and be altered into a noble metal film 6c as illustrated in FIG. 11.

Figure 12:
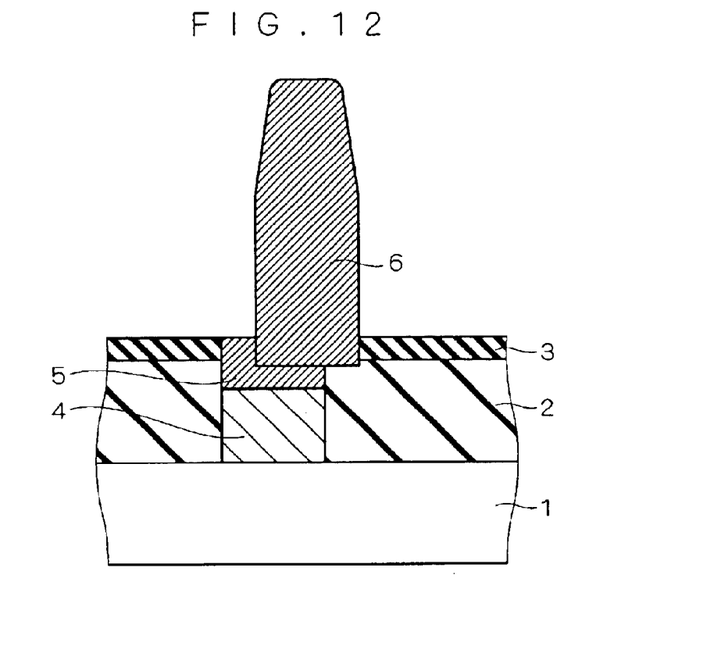

Thereafter, the mold 10 is removed by an etching process (FIG. 12). For the etching process, an RIE process using a mixed gas of a $C_4F_8$ gas and an oxygen gas may be suitably employed. Additionally, also shoulders of the noble metal film 6c are slightly etched by the etching process for removing the mold 10, to be tapered. Then, the lower electrode 6 is completed.

Figure 13:
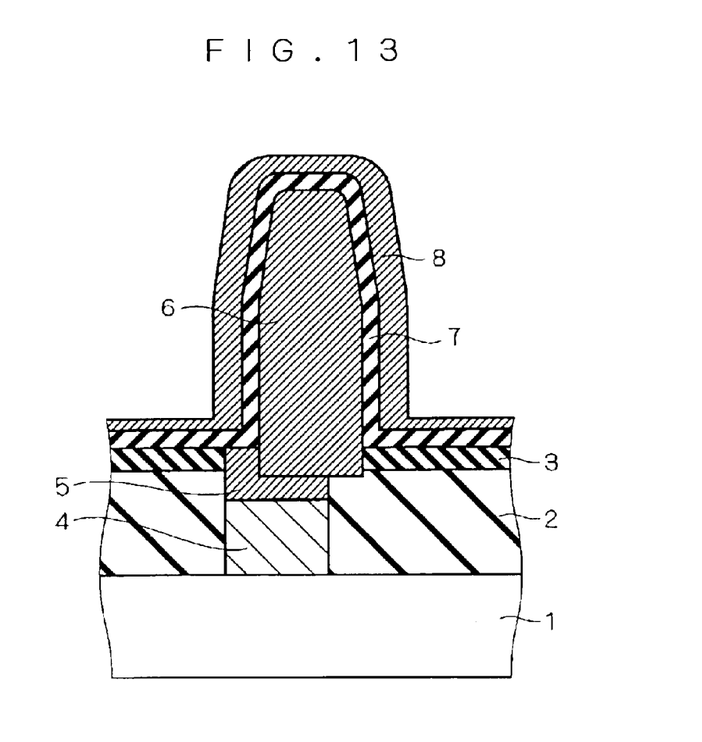

Next, the dielectric film 7 made of a high dielectric constant material is formed on the lower electrode 6, the second interlayer insulating film 3 and the conductive film 5, and subsequently the upper electrode 8 made of a noble metal is formed on the dielectric film 7 (FIG. 13). For formation of the dielectric film 7 and the upper electrode 8, while any arbitrary procedure can be employed, a sputtering process may be suitably employed, for example. Further, the thickness of each flat portion of the dielectric film 7 and the upper electrode 8 may be suitably controlled to be approximately 80 nm, in order to ensure complete coverage of sides of the lower electrode 6.

Thereafter, the third interlayer insulating film 9 is formed, and further the aluminum interconnect not shown is formed above the third interlayer insulating film 9, to complete the semiconductor device illustrated in FIG. 1.

In accordance with the semiconductor device and the manufacturing method thereof of the first preferred embodiment, the conductive film 5 and the noble metal film 6b are made of the same material. Hence, connection between the conductive film 5 and the noble metal film 6b is strengthened, and thus is readily maintained during a heat treatment on the noble metal film 6b. Accordingly, the shape of the electrode is not likely to deform. As a result, the semiconductor device of the first preferred embodiment allows for more reliable connection between the conductive plug 4 and the lower electrode 6 as compared with the semiconductor device illustrated in FIG. 17 in which the conductive plug 4 is connected directly to the lower electrode 6. More specifically, the semiconductor device of the first preferred embodiment hardly allows the vacancy 10c as shown in FIG. 18 to be left between the lower electrode 6 and the conductive plug 4. Therefore, the semiconductor device and the manufacturing method thereof according to the first preferred embodiment provides for formation of a semiconductor device which is highly resistant to vibration, impact or the like.

It might be suggested that the conductive film 5 be made of a material which is different from that of the noble metal film 6b, but is capable of strengthen connection between the lower electrode 6 and the conductive plug 4. However, in that situation where the conductive film 5 and the lower electrode 6 are made of different materials, there is a possibility that a substance constituting the conductive film 5 is diffused through the lower electrode 6, to adversely affect the dielectric film 7 being in contact with the lower electrode 6, for example.

In contrast thereto, according to the present invention, the conductive film 5 and the lower electrode 6 are made of the same material. Accordingly, by choosing an appropriate material of the lower electrode 6, it is possible to avoid such adverse effects.

Moreover, in accordance with the semiconductor device and the manufacturing method thereof of the first preferred embodiment, the lower electrode 6 is formed so as not to completely cover the surface of the conductive film 5 exposed in the contact hole 10a and to dig into the conductive film 5. Accordingly, not only the lower electrode 6 is in contact with the conductive film 5 simply at a bottom face of the lower electrode 6, but also a side of the lower electrode 6 is in contact with the side 10b of the conductive film 5. This provides for increased reliability in connection between the conductive film 5 and the lower electrode 6.

Second Preferred Embodiment

A second preferred embodiment is a modification of the semiconductor device and the method of manufacturing a semiconductor device according to the first preferred embodiment, in which the surface of the conductive film 5 exposed in the contact hole 10a is completely covered by the lower electrode 6.

Figure 14:
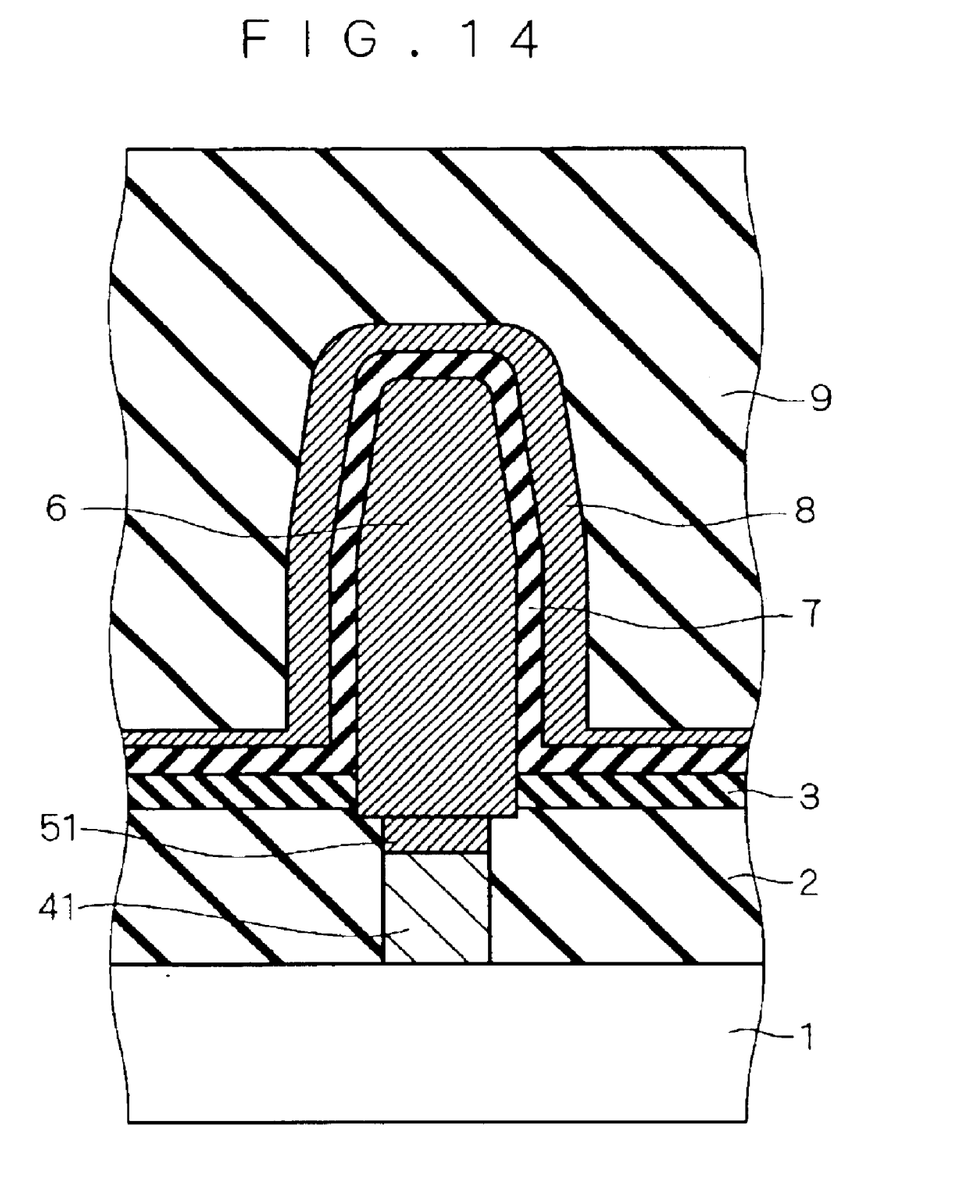
FIG. 14 is a view illustrating a semiconductor device according to a second preferred embodiment of the present invention.

FIG. 14 is a view illustrating a semiconductor device according to the second preferred embodiment. In FIG. 14, each element having the same function as that of any of the elements of the semiconductor device according to the first preferred embodiment is denoted by the same reference numeral as used in the first preferred embodiment.

According to the second preferred embodiment, as illustrated in FIG. 14, the semiconductor device includes a conductive plug 41 and a conductive film 51 in place of the conductive plug 4 and the conductive film 5 of the semiconductor device according to the first preferred embodiment. The conductive plug 41 and the conductive film 51 are thinner than the conductive plug 4 and the conductive film 5, and the surface of the conductive film 51 is completely covered by the lower electrode 6. In all the other respects, the structure of the semiconductor device according to the second preferred embodiment is identical to that of the semiconductor device according to the first preferred embodiment, detailed description of which will be omitted.

In view of the foregoing structure where the surface of the conductive film 51 is completely covered by the lower electrode 6, only the bottom face of the lower electrode 6 is in contact with the conductive film 51. Accordingly, connection between the conductive film 51 and the lower electrode 6 is not so strong as connection between the conductive film 5 and the lower electrode 6 in the first preferred embodiment. Nonetheless, the semiconductor device according to the second preferred embodiment can still provide for more reliable connection between the conductive plug 41 and the lower electrode 6 than connection between the conductive plug 4 and the lower electrode 6 in the semiconductor device illustrated in FIG. 17, for the reasons similar to those explained in the first preferred embodiment.

Third Preferred Embodiment

A third preferred embodiment is another modification of the semiconductor device and the method of manufacturing a semiconductor device according to the first preferred embodiment. In particular, according to the third preferred embodiment, a silicon interlayer film which is adhered to the lower electrode is additionally provided at a predetermined level in the mold for a damascene process.

More specifically, a silicon interlayer film 12 which is adhered to the lower electrode 6 is provided at a predetermined level in the mold 10 for a damascene process. It may be suitable to control the thickness of the silicon interlayer film 12 to be 50 nm, for example. The silicon interlayer film 12 can be easily formed by switching a gas used for a CVD process to another gas during formation of the mold 10. Further, if ruthenium is employed as the lower electrode 6, a polysilicon film may be employed for forming the silicon interlayer film 12, for example.

A heat treatment on a silicon film and a metal causes silicidation reaction therebetween to provide a silicided portion, which serves to adhere the silicon film and the metal to each other. Accordingly, to provide a polysilicon film as the silicon interlayer film 12 at a predetermined level in the mold 10 would produce the same effects produced by provision of the conductive film 5. In other words, the silicon interlayer film 12 can function to fix the lower electrode 6 through faces 12a in which the lower electrode 6 and the silicon interlayer film 12 are adhered to each other.

Thus, by performing a heat treatment on the lower electrode 6 while causing silicidation reaction in an interface between the silicon interlayer film 12 and the lower electrode 6, it is possible to easily maintain connection between the lower electrode 6 and the conductive plug 4. Accordingly, the lower electrode 6 is not likely to deform. As a result, connection between the conductive plug and the capacitor electrode becomes more reliable, so that a semiconductor device highly resistant to vibration, impact or the like can be obtained.

Figure 15:
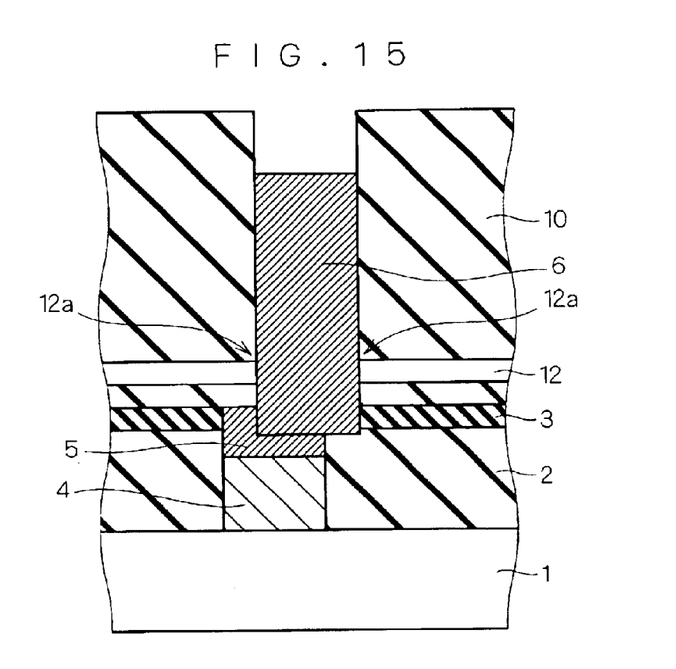
FIGS. 15 and 16 are views illustrating a method of manufacturing a semiconductor device according to a third preferred embodiment of the present invention.

Additionally, the silicon interlayer film 12 may be removed together with the mold 10, or alternatively be kept un-removed. If the silicon interlayer film 12 is kept un-removed, it functions to fix the lower electrode 6 in a finished device, to provide for increased reliability in connection between the conductive plug 4 and the lower electrode 6. In order to keep the silicon interlayer film 12 un-removed, only a portion of the mold 10 located above the silicon interlayer film 12 as shown in FIG. 15 is removed, for example.

On the other hand, there can be possibly a case where the silicon interlayer film 12 is processed in some way by other steps after the formation of the lower electrode 6, to adversely affect an entire manufacture of the semiconductor device. For example, the effects of a heat treatment are exerted on the silicon interlayer film 12, so that constituents of the silicon interlayer film 12 may be diffused through the lower electrode 6 to adversely affect the capacitor dielectric film 7 being in contact with the lower electrode 6. When such situation is very likely to occur, it is suitable to remove the silicon interlayer film 12 together with the mold 10, thereby to prevent the silicon interlayer film 12 from being processed by the steps after the formation of the lower electrode 6. This prevents the manufacture of the semiconductor device from being adversely affected by the silicon interlayer film 12.

Figure 16:
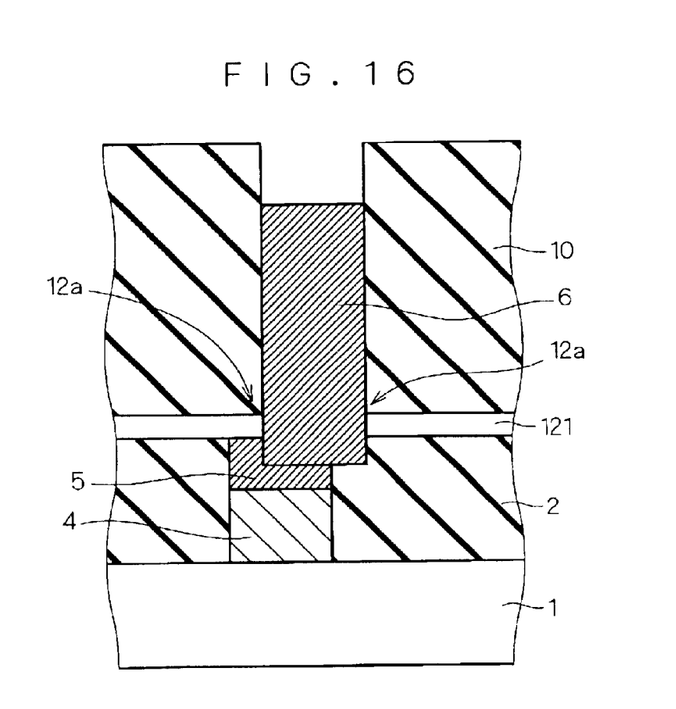

Alternatively, as illustrated in FIG. 16, the formation of the second interlayer insulating film 3 may be omitted and a silicon interlayer film 121 made of a polysilicon film may be formed directly on the first interlayer insulating film 2. The silicon interlayer film 121 can function to fix the lower electrode 6 through faces 12a in which the lower electrode 6 and the film 121 are adhered to each other in the same manner as the silicon interlayer film 12 illustrated in FIG. 15.

Moreover, by employing a material having a high etch selectivity relative to the material of the mold 10, for forming the silicon interlayer film 12 or 121, it is possible to have the silicon interlayer film 12 or 121 also function as an etch stopper in the etching process for removing the mold 10. This eliminates the need of forming the second interlayer insulating film 3. If a silicon dioxide film is employed for forming the mold 10, it is possible to have the silicon interlayer film 12 or 121 function as an etch stopper by employing a polysilicon film for forming the silicon interlayer film 12 or 121.

Additionally, while both the conductive film 5 and the silicon interlayer film 12 or 121 are used in the structures illustrated in FIGS. 15 and 16, the conductive film 5 may not necessarily be provided, in which case the lower electrode 6 is fixed only by the silicon interlayer film 12 or 121.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate;

an interlayer insulating film formed on said semiconductor substrate;

a contact hole passing through said interlayer insulating film to reach a surface of said semiconductor substrate;

a conductive plug formed in said contact hole and connected to said surface of said semiconductor substrate;

a conductive film formed in said contact hole so as to be adhered to a top face of said conductive plug;

a first capacitor electrode connected to said conductive film;

a capacitor dielectric film being in contact with said first capacitor electrode; and a second capacitor electrode, said capacitor dielectric film being interposed between said first and second capacitor electrodes, to form a capacitor, wherein said conductive film is made of a material identical to that of said first capacitor electrode, and said first capacitor electrode is connected to said conductive film so as not to completely cover a surface of said conductive film exposed in said contact hole and to dig into said conductive film.

2. The semiconductor device according to claim 1, wherein said material of said conductive film and said first capacitor electrode is a metal.

3. A semiconductor device according to claim 2, wherein said metal is ruthenium.

* * * * *